United States Patent [19]
Kohl et al.

[11] Patent Number: 4,576,691
[45] Date of Patent: Mar. 18, 1986

[54] ETCHING OPTICAL SURFACES ON GAAS

[75] Inventors: Paul A. Kohl, Chatham; Lawrence E. Smith, Plainfield; Harvey S. Trop, South Plainfield, all of N.J.

[73] Assignee: AT&T Bell Laboratories, Murray Hill, N.J.

[21] Appl. No.: 636,177

[22] Filed: Jul. 31, 1984

[51] Int. Cl.⁴ .......................... C25F 3/12; C25F 3/14
[52] U.S. Cl. .......................... 204/129.3; 204/129.75
[58] Field of Search .................... 204/129.75, 129.3

[56] References Cited
U.S. PATENT DOCUMENTS

| | | | |
|---|---|---|---|
| 4,369,099 | 1/1983 | Kohl | 204/129.3 |
| 4,389,291 | 6/1983 | Kohl | 204/129.3 |
| 4,404,072 | 9/1983 | Kohl | 204/129.3 |

Primary Examiner—T. M. Tufariello
Attorney, Agent, or Firm—Walter G. Nilsen

[57] ABSTRACT

Photoelectrochemical etching of gallium arsenide in highly alkaline aqueous solution yields optically smooth etched surfaces suitable for many optical devices. Higher optical quality is obtained for lower irradiation energy provided sufficient energy is available to produce holes in the valence band.

11 Claims, 4 Drawing Figures

ETCHING OPTICAL SURFACES ON GAAS

TECHNICAL FIELD

The invention is a process for etching gallium arsenide and related compound semiconductors.

BACKGROUND OF THE INVENTION

The rapid development of the semiconductor industry and the increasing need for more and more unique semiconductor devices have resulted in the development of a variety of processes for producing such devices. A particularly interesting example is the group of processes involving photoelectrochemical etching of compound semiconductors. In such processes, light (or radiation of some kind) is needed to produce etching. Usually, the rate of etching is proportional to the intensity of radiation. This makes possible etching of various geometrical features on compound semiconductors including, for example, straight-walled holes, channels, etc. Some of these processes have been outlined in a variety of references including U.S. Pat. No. 4,404,072, issued to P. A. Kohl et al on Sept. 13, 1983; U.S. Pat. No. 4,389,291, issued to P. A. Kohl et al on June 21, 1983 and U.S. Pat. No. 4,369,099, issued to P. A. Kohl et al on Jan. 18, 1983.

Particularly rapid development has taken place in the last few years in one area of semiconductor technology namely the use of compound semiconductors in optical devices. Typical optical semiconductor devices are semiconductor lasers, light-emitting diodes, photodetectors, etc. Often, these devices require geometrical shaping to maximize efficiency, optical coupling, etc. A typical example is the fabrication of light-emitting diodes with lenses to collect and direct the radiation output of the light-emitting diode in a particular direction.

Typically, it is desired to produce a particular geometrical shape (e.g., a lens) with a surface of high optical quality so as to minimize scattering and undesirable reflections. In addition, rapid processing and batch processing are desirable to minimize cost and maximize manufacturing throughout. For example, in the production of LED devices, usually many devices are contained on a wafer and simultaneous processing would lead to rapid production and much reduced cost.

SUMMARY OF THE INVENTION

The invention is a process for photoelectrochemically etching n-type or intrinsic gallium arsenide and related compounds in which the etched surface produced is of optical quality. The process is most useful for nominally pure gallium arsenide with up to five mole percent other elements either included for doping or to provide easy growth of the crystals. The process involves applying an electrochemical potential to the compound semiconductor, which value is within a specific range determined by the particular compound semiconductor being etched and the composition of the electrolytic solution, and illuminating the surface being etched with radiation of sufficient energy to produce holes in the valence bend of the compound semiconductor. Lower radiation energy is preferred (provided holes are produced) because it yields smoother etched surfaces of higher optical quality. For this reason, a wavelength greater than about 700 nm. is preferred.

The composition of the electrolytic solution is of great importance in producing optical quality etched surfaces by this procedure. The electrolytic solution should be aqueous, with conductivity of at least 0.0001 mho per cm (preferably greater than 0.01 mho per cm). The electrolytic solution should contain sufficient alkaline agent (e.g., NaOH, KOH, LiOH, etc.) to make the solution highly alkaline (pH greater than 11 or even 12 or 13). Best results are obtained with a concentration of KOH between 0.1 molar and saturation with $2 \pm 0.2$ molar most preferred. The procedure is exceedingly useful to thin, separate and etch alignment features in gallium arsenide devices such as light-emitting diodes. Also of interest is etching lenses on light-emitting diodes. Devices processed in accordance with the invention are made rapidly, with low cost and high optical quality. Also of much importance commercially is the fact that various geometric features (e.g., lenses) can be etched on a large number of devices (e.g., chips on a wafer) simultaneously.

DETAILED DESCRIPTION

Figure 1:
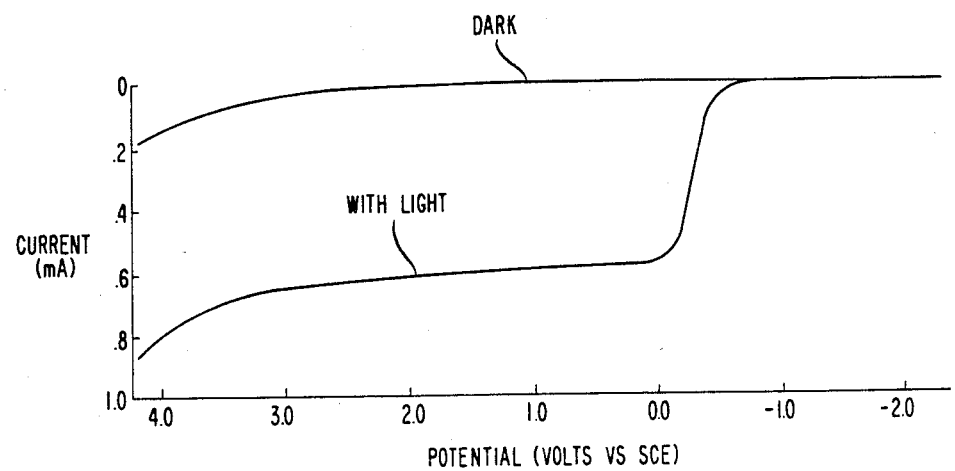
FIG. 1 shows a voltammogram of n-type GaAs in 2.0 molar aqueous NaOH.

The invention depends on the observation that an electrochemical photoetching procedure carried out on gallium arsenide and closely related compounds in an electrolytic solution which is highly alkaline yields surfaces of high optical quality. Scattering on such surfaces from the light-emitting diode is very low due to the very smooth surfaces produced. Roughness is less than about one quarter wavelength inside the light-emitting diode (about 0.1 $\mu$m). Such an etching procedure is highly advantageous because high-quality optical devices can be made without polishing individual surfaces.

In the electrochemical photoetching process, the compound semiconductor is made part of an oxidation-reduction reaction. The compound semiconductor is made the anode and a counter-electrode (usually an inert metal such as platinum or platinized titanium) made the cathode. A potential is applied to the semiconductor, the value of which is discussed below. Etching results from a decomposition reaction induced by photogenerated holes at the interface between semiconductor and the electrolytic solution.

The process is particularly useful for gallium arsenide used as a substrate in an optical device (laser, light-emitting diode, photodetector, integrated circuit, etc.) although the process may be used on other types of gallium arsenide circuits. Limited amounts of other substances may be included in the gallium arsenide such as doping substances, compensation substances or substances to facilitate easy growth of the gallium arsenide crystal, etc. Generally, this is limited to about five weight percent. Both intrinsic and n-type material may be etched by the inventive process. Intrinsic semiconductors refer to a class of semiconductors where the number of holes and electrons in the absence of radiation are nearly equal (usually within a factor of 100). Intrinsic semiconductors include undoped semiconductors and compensated semiconductors (semiconductors doped with traps to compensate for impurities or other dopants). An example of a compensated semiconductor compound is gallium arsenide doped with chromium at a concentration level of about $10^5$ to $10^7$ atomer per cubic centimeter with $10^{16}$ most preferred. Typically, such semiconductors are semi-insulating with resistivities greater than $10^6$ ohm-cm or more usually greater than $10^7$ or $10^8$ ohm-cm. However, it should be recognized that the etching process works on intrinsic compound semiconductors with much lower resistivities. Often, such materials are useful for substrates because of their semi-insulating characteristics.

Also included are n-type compound semiconductors where electrons exceed holes. Usually, n-type semiconductors are obtained by substituting donors into the lattice (e.g., sulfur, selenium or tellurium for group V elements or silicon for group III elements in a III-V semiconductor). Typical doping levels are $10^{15}$ to $10^{19}$ atoms per cubic centimeters, with $10^6$ to $10^{18}$ atoms per cubic centimeters preferred for many applications. The process is useful on compound semiconductors where radiation with energy greater than the bandgap of semiconductor has a significant effect on the minority carrier population. In general, this means that in the absence of light, hole carrier population should not exceed electron carrier population in the compound semiconductor by more than a factor of 100.

An electric power source (i.e., battery, electronic power supply, etc.) is used to supply power for the electrochemical reaction and apply potential to the compound semiconductor. Meters are usually used in the circuit to measure potential (usually against a saturated KCl Calamel Electrode, SCE, also located in the electrolytic solution) and current. The current is proportional to the etch rate and therefore is a convenient monitor for the etching process.

The potential on the compound semiconductor to be photoetched is particularly important because too high a potential will lead to etching in the absence of radiation and too low a potential will prevent any etching even in the presence of radiation. As a general criteria, the potential should be between the maximum potential of the valence band in the particular electrochemical solution being used and the flat band potential under these same conditions. The flat band potential is approximately the conduction band minimum for n-type compound semiconductors and about halfway between valence and conduction band for intrinsic or semi-insulating compound semiconductors. Often these various potentials are known or can be found from various literature references. For n-type gallium arsenide in a highly alkaline electrolytic solution, (two molar NaOH in water) the potential should be between $-0.5$ and $2.0$ volts on the SCE scale (Saturated Calamel Electrode). The SCE scale is used throughout this disclosure and is $+0.242$ volts greater than the well-known hydrogen potential. Best results are found where etching in the absence of light is minimum and the etching rate with light is reasonably high (typically 0.1 to 3.0 microns/minute). For this reason, the preferred range is $-0.2$ to $1.0$ or even $-0.2$ to $0.7$ volts on the SCE scale. These measurements were carried out in 2 molar NaOH on the face of n-type GaAs. One curve shows the etching rate (current passing through the semiconductor) as a function of potential applied to the semiconductor on the SCE scale. One curve (labeled with light) shows the etching rate with radiation applied to the etch area; the other curve (labeled dark) shows the etch rate in the absence of radiation. Usually, the region of greatest interest is where "dark" etching is zero particularly where precise geometrical features are desired. High ratios of etch rate with light to etch rate without light insures that etching features are being determined by the light characteristics and not by isotropic etching mechanisms.

Where the relevant potentials are not known or where more accurate potentials are desired, a direct measurement of these quantities can be made by taking a voltammogram of the particular compound semiconductor. Here, the rate of etching is measured (by observing the current as described above) as a function of applied potential with and without radiation incident on the surface of the compound semiconductor. It is found that in one region of potential, high etching (as evidenced by high currents) is observed with radiation but essentially no etching (near zero current) without radiation. It is this region of potential that is of interest in the electrochemical photoetching process.

A typical voltammogram is shown in FIG. 1 for n-type GaAs (doped with silicon to about $10^{18}$ atoms per cubic centimeters).

Various light sources may be used provided at least part of the light source contains sufficient energy to create holes in the valence band at the surface of the compound semiconductor. This requirement is most easily met by using radiation with energy equal to or greater than the bandgap of the compound semiconductor. Under some circumstances, light energy less than the bandgap of the compound semiconductor may be used because of energy states in the bandgap. Often, these energy states are due to impurities, doping elements, compensation elements, and crystal imperfections. However, for convenience and etching speed, radiation with energy greater than the bandgap is preferred. Broad-band radiation (as from a tungsten lamp) or essentially monochromatic radiation (as from a laser) may be used. Lenses and other optical means may be used to achieve desired raw direction, concentration of radiation, etc.

Where high optical quality is at a premium, lower energy radiation is preferred provided photon energy is sufficient to create holes in the valence band. A variety of methods are used to limit radiation energy including, for example, use of filters, fluorescent light sources with energy primarily in the red, and use of red lasers. An excellent laser source is the He-Ne laser.

Figure 2:
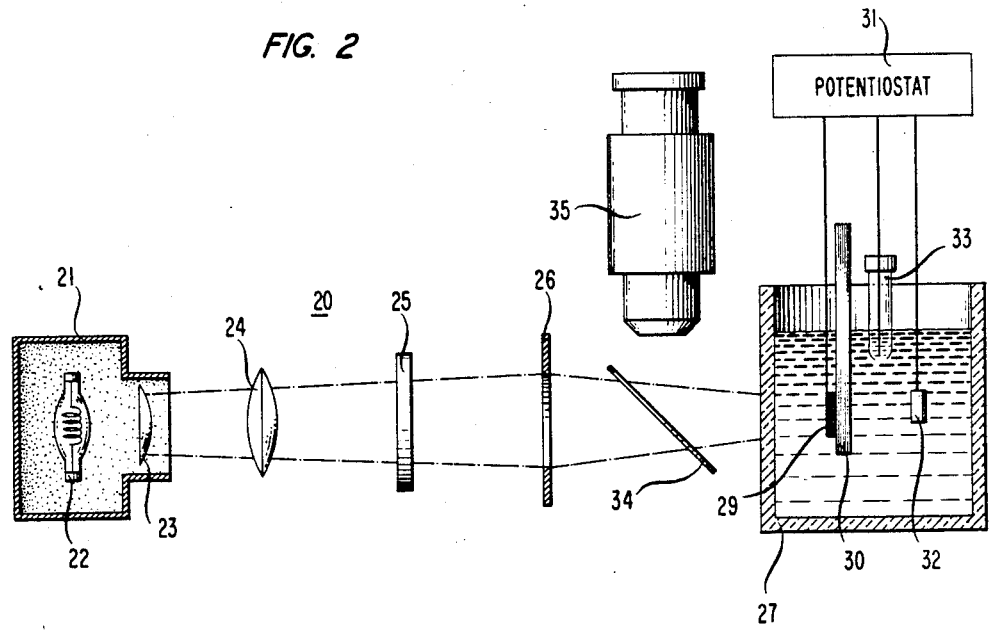
FIG. 2 shows a diagram of an apparatus useful in the practice of the invention.

For many applications, a mask is used to confine the radiation (and therefore the etching) to specific regions. Masks may also be used to vary the etching rate over some portion of the semiconductor surface by varying the light transmission over some portion of the surface. Partially reflecting or absorbing masks may be used. Often photographic emulsions are used in making such masks. In other applications, a metal mask is used and the metal serves as the electrical contact to the semiconductor. A particularly convenient apparatus for carrying out the procedure is shown on FIG. 2. This apparatus 20 is essentially a projection system for concentrating radiation on the surface of the semiconductor and insuring that the light rays are properly collimated. The apparatus consists of a projection light source 21, with 100 watt tungsten-halogen lamp 22 and collecting lens 23. A lens 24 is used to direct the light rays at the semiconductor surface being etched and an optical filter 25 is used to remove unwanted parts of the radiaton spectrum of the tungsten-halogen lamp. Where surfaces of high optical quality are desired, often only the red part of the spectrum is transmitted to the semiconductor surface. An aperture 26 is used to limit the amount of radiation reaching the semiconductor surface.

The electrochemical part of the apparatus is made up of a cell 27 containing the electrolytic solution 28 and various electrodes. The semiconductor 29 is mounted on a holder 30 and electrically connected to a potentiostat-type power source 31. The counter-electrode 32 and reference electrode 33 are also connected to the power source. Visual observation of the etching process is made possible using a pellicle beam splitter 34 and microscope 35. The entire cell is usually mounted on a stage that allowed 3 translational and 3 rotational degrees of freedom. This permitted fine adjustment of the semiconductor wafer with respect to the light source.

Figure 3:
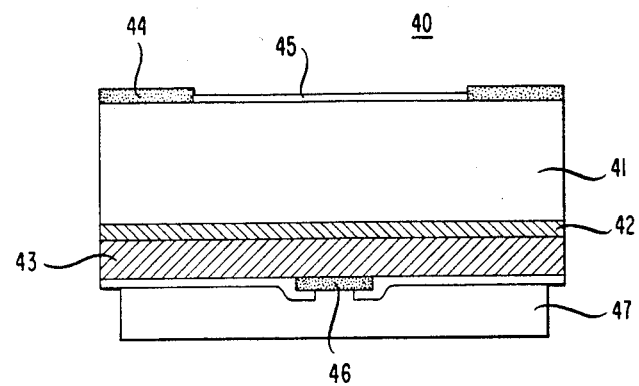
FIG. 3 shows a cross sectional of a typical light-emitting diode.

An important application of the invention is in the fabrication of gallium arsenide light-emitting diodes (LED). Here, the active regions of the LED (generally various compositions of gallium alumium arsenide) are grown on a gallium arsenide substrate and the gallium arsenide removed by photoelectrochemical etching. The resulting device is shown in FIG. 3. The LED 40 is made up of three semiconductor layers: The first layer 41 is n-type gallium aluminum arsenide usually with composition $Ga_{0.7}Al_{0.3}As$ and doped with tellurium. The second layer 42 is p-type gallium aluminum arsenide with composition $Ga_{0.91}Al_{0.09}As$ and doped with germanium. The third layer 43 is p-type gallium aluminum arsenide with about 28 mole percent aluminum and doped with germanium. These layers are grown onto a gallium arsenide substrate usually by liquid phase epitaxy and the gallium arsenide removed by photoelectrochemical etching in accordance with the invention. The device is also equipped with an n-type contact 44, usually made of gold, a dielectric layer 45 usually made of $SiN_x$, a p-type contact 46 usually made of gold or gold-tin, a dielectric layer 47 usually made of $SiN_x$ and a heat sink 48 made of gold. Typically, such an LED emits radiation at about 0.87 microns.

Figure 4:
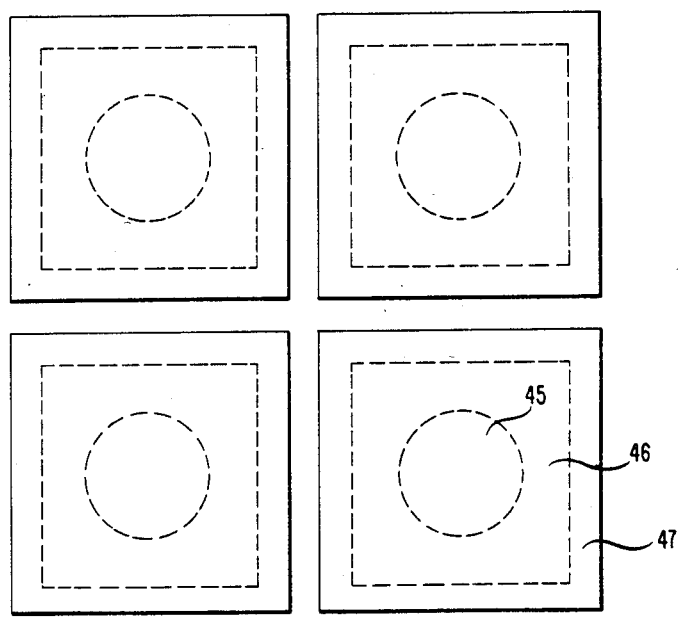
FIG. 4 shows part of a semiconductor wafer with several individual LED devices.

The inventive process is also useful in separating individual devices (chips) from a wafer assembly. Part of a typical wafer 50 is shown in FIG. 4. Shown is the gold heat sink, gold, n-contact 44 and dielectric layer 45 where radiation exits the LED device. Collimated light is used to photoelectrochemically etch the channels between the gold heat sinks 51. The collimated light insures that the channel etched has straight walls at right angles to the surface of the semiconductor.

What is claimed is:

1. A process for fabricating an optical device comprising at least one n-type or intrinsic compound semiconductor consisting of at least 95 mole percent gallium arsenide comprising the step of etching at least part of the compound semiconductor to produce a compound semiconductor surface of optical quality characterized in that the etching procedure is an electrochemical photoetching procedure in which electric current is passed through the compound semiconductor, electrolytic solution with conductivity greater than 0.0001 mhos/cm and anode in which the electrochemical photoetching procedure further comprises
    a. applying a potential to the semiconducting compound which is between the maximum potential of the valence band of the semiconductor compound in the electrolytic solution and the minimum potential of the conduction band of the semiconductor compound in the electrolytic solution;
    b. illuminating the part of the surface of the compound semiconductor to be etched with radiation of sufficient energy to produce holes in the valence band; and
    c. the electrolytic solution comprises aqueous alkaline solution with pH greater than 11.

2. The process of claim 1 in which the compound semiconductor consists essentially of n-type gallium arsenide.

3. The process of claim 1 in which the pH is greater than 12.

4. The process of claim 3 in which the pH is greater than 13.

5. The process of claim 4 in which the electrolytic solution comprises KOH in the concentration range from 0.1 to 2±0.2 molar.

6. The process of claim 1 in which the roughness of the compound semiconductor surface of optical quality is less than about one quarter of a wavelength inside the compound semiconductor.

7. The process of claim 1 in which the radiation wavelength is greater than about 700 nm.

8. The process of claim 1 in which the potential is between −0.2 and 1.0 volts on the SCE scale.

9. The process of claim 8 in which the potential is between −0.2 and 0.7 volts on the SCE scale.

10. The process of claim 1 in which the device is a light-emitting diode.

11. A device produced by the process of claim 1.

* * * * *